United States Patent [19]
Whiting et al.

[11] 3,945,100
[45] Mar. 23, 1976

[54] AXIAL LEAD COMPONENT PREFORMING AND INSERTION APPARATUS

[75] Inventors: Roy M. Whiting, Binghamton, N.Y.; Henry J. Soth, Brackney, Pa.; Phillip A. Ragard, Binghamton, N.Y.

[73] Assignee: Universal Instruments Corporation, Binghamton, N.Y.

[22] Filed: Feb. 3, 1975

[21] Appl. No.: 546,716

[52] U.S. Cl. ............. 29/33 M; 29/203 DT; 29/626; 140/105; 277/90
[51] Int. Cl.² .......................................... H05K 3/30
[58] Field of Search ........... 29/33 M, 203 B, 203 D, 29/203 DT, 626; 227/85, 86, 87, 88, 89, 90, 91; 140/105

[56] References Cited
UNITED STATES PATENTS

| 3,149,340 | 9/1964 | Gagnon | 227/90 |
| 3,427,849 | 2/1969 | Ainsworth et al. | 140/105 X |
| 3,540,494 | 11/1970 | Susong | 140/105 X |
| 3,907,008 | 9/1975 | Bates et al. | 140/105 |

Primary Examiner—Othell M. Simpson
Assistant Examiner—Z. R. Bilinsky
Attorney, Agent, or Firm—Fidelman, Wolffe & Waldron

[57] ABSTRACT

An apparatus for sequentially feeding axial lead electrical components to a first plane, severing surplus lead material, bending one lead so that said component and said other lead are perpendicular to the first plane, preforming the end of the other lead into an L-shape, bending the remaining section of the one lead to be perpendicular to the first plane and inserting the leads into holes in a circuit board.

13 Claims, 10 Drawing Figures

AXIAL LEAD COMPONENT PREFORMING AND INSERTION APPARATUS

BACKGROUND OF THE INVENTION

1. Field of the Invention

The present invention relates generally to electronic component insertion devices apparatus and more specifically to an apparatus for preforming the leads of an axial lead electrical component so that the component may be inserted into pre-lined holes in a circuit board with the axial axis of the component perpendicular to the circuit board.

2. Description of the Prior Art

Heretofore, tape mounted axial lead components have been fed to an insertion head which is adapted in sequence to sever the leads of a presented component in order to separate such component from a pair of spaced carrier tapes, bend the severed leads at right angles to the axis of the separated component, and finally drive the bent leads into preformed apertures provided in a circuit board disposed below the insertion head.

Typical examples of the above are the single component insertion device of U.S. Pat. No. 3,593,404 and a multiple component insertion device as shown in U.S. Pat. No. 3,796,363. Even film-mounted electrical components have been inserted with their bodies parallel to the circuit board, as illustrated in U.S. Pat. No. 3,783,488.

To increase the packing density on circuit boards, it has been suggested that the shortest dimension of an electrical component (that is, the diameter) be parallel to the circuit board, instead of the longest dimension (that is, the length). To this end, the "Insertion Apparatus" of U.S. application Ser. No. 501,682, file Aug. 29, 1974, was developed which application is commonly assigned with the instant application and is understood to be incorporated herein by reference. The apparatus of the present case is intended as an improvement over that as shown in Ser. No. 501,682.

SUMMARY OF THE INVENTION

The apparatus of the present invention performs and inserts axial lead components so that the axis of the component is perpendicular to the circuit board into which it is inserted. Axial lead components which are normally mounted to a long continuous pair of tapes are sequentially fed so as to be aligned one at a time in a first plane which includes the two leads and the axial axis of the component. Intially, both the first and second leads are supported under indexing wheel. Subsequently, a first bending mechanism starting at the first plane starts an arcuate path which severs the first lead against a severing block and continues an arcuate path bending the second lead so that the first lead, the body and a section of the second lead are substantially perpendicular to the first plane at the end of its arcuate path. An anvil is provided at the end of the arcuate path of the first bending device to cooperate therewith so as to preform the end of the first lead. After the first bending device has completed its arcuate path, the second lead is severed and a second bending device (which will be the outside supporter for the insertion device) starts a linear motion perpendicular to said first plane so as to bend the remaining section of the second lead so as to be perpendicular to said first plane. The insertion mechanism includes the second bending device, a second outside supporter and a component driver therebetween. A post about which the first lead is bent and the anvil of the preforming section are mounted to a resilient housing and lie within the path of the insertion tool. The housing and the insertion tool each contain camming surfaces cooperating to force the post of the bending device and the anvil of the preforming device out of the path of travel of the insertion tool.

OBJECTS OF THE INVENTION

An object of the present invention is to provide an improved apparatus for preforming leads of axial lead electrical components so that the component axis is parallel to the leads to be inserted in a circuit board.

Another object is to provide a more efficient and reliable axial lead component preforming and insertion apparatus capable of increased packing density.

Other objects, advantages and novel features of the present invention will become apparent from the following detailed description of the invention when considered in conjunction with the accompanying drawings.

DESCRIPTION OF THE PREFERRED EMBODIMENTS

Figure 1:
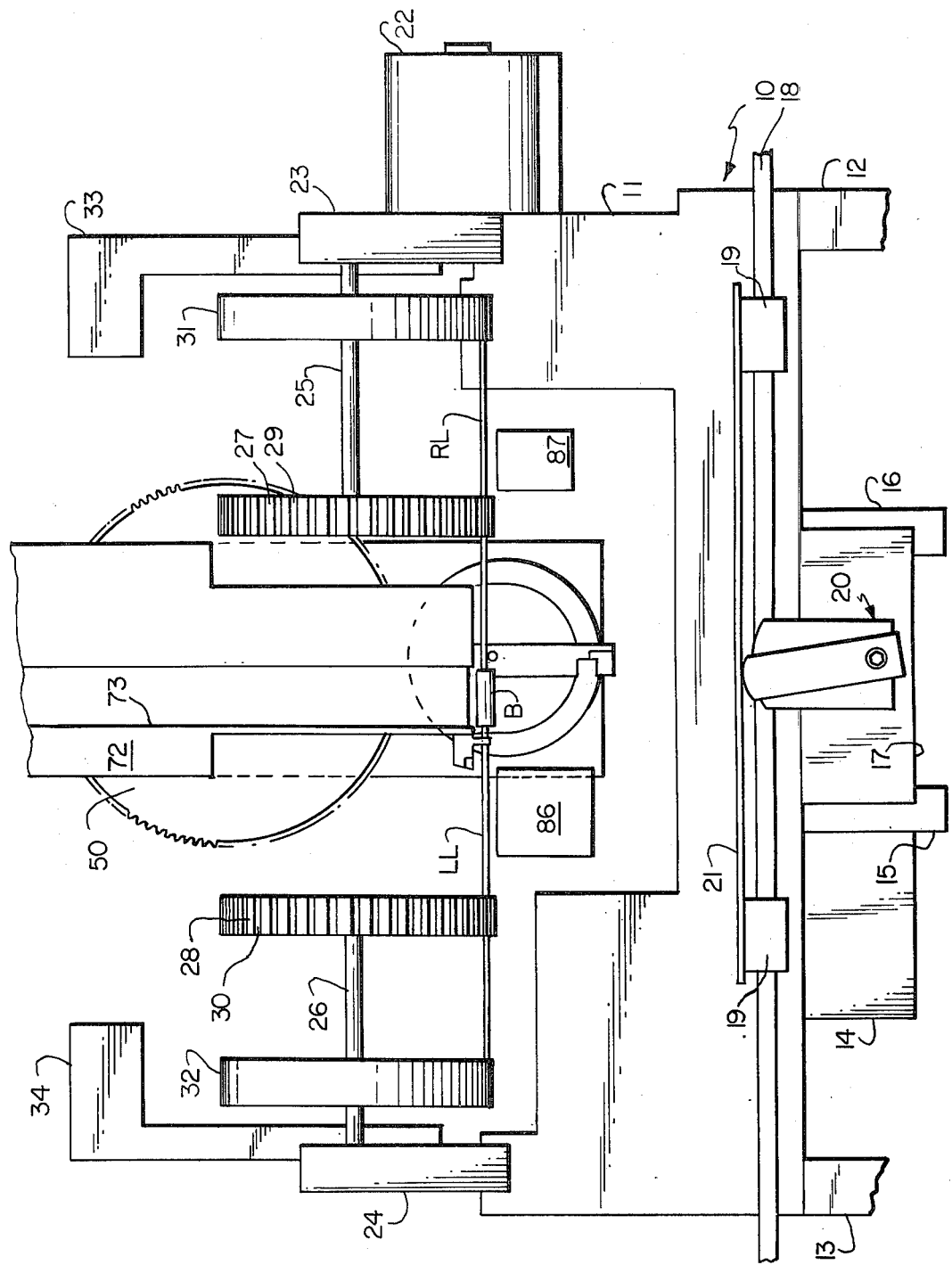
FIG. 1 is a front view of a preferred embodiment of the preforming and insertion apparatus of the present invention.

Referring to FIG. 1, there is shown the apparatus designated as 10. It consists of a main housing 11 having supporting legs 12 and 13. A lower member 14 supports vertical guides 15, 16 on which a support member 17 is mounted for vertical movement. Member 17 is controlled by a pneumatic cylinder (not shown) which enables it to rise to the position shown or move downwardly. Mounted on member 17 is a lead shearing and forming mechanism 20, as contained in application Ser. No. 501,682. A printed circuit board 21 is attached to a carriage 19 slidable on rails 18. The position of the circuit board 21 is controlled by any of the well known x, y positioning systems which are not shown in detail for the sake of clarity.

A pneumatic cylinder 22 is mounted on the side of housing 11 and drives through linkage (ratchet and pawl not shown) in assemblies 23 and 24, a pair of shafts 25 and 26. Mounted on the shafts are indexing wheels 27 and 28 having lead receiving grooves such as 29 and 30. Also mounted on the shafts are a pair of tape supporting wheels 31 and 32. A pair of guides 33 and 34 are located atop assemblies 23 and 24, respectively, to guide the tape containing the components onto tape supporting wheels 31 and 32.

It should be noted that the entire apparatus is driven through pneumatic cylinders. The cylinders can be operated sequentially by a central cam operated pneumatic control or be controlled by a tape reader or computer which, in turn, operates the pneumatic central control. Cylinder 22 indexes each time an operation is completed to bring another taped component into line for forming. While a pneumatic mode of control is contemplated, other means (such as mechanical, electrical or hydraulic means) may be employed.

Figure 2:
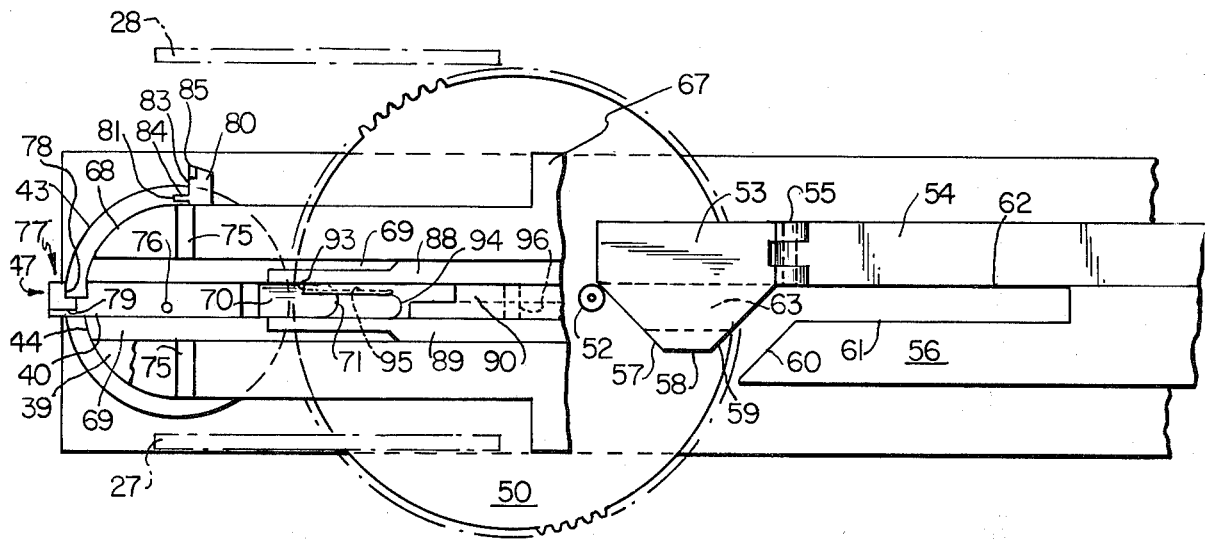
FIG. 2 is a front view of the preforming and insertion assemblies of the present invention with the cover plate removed and parts broken away for purposes of clarity.
Figure 3:
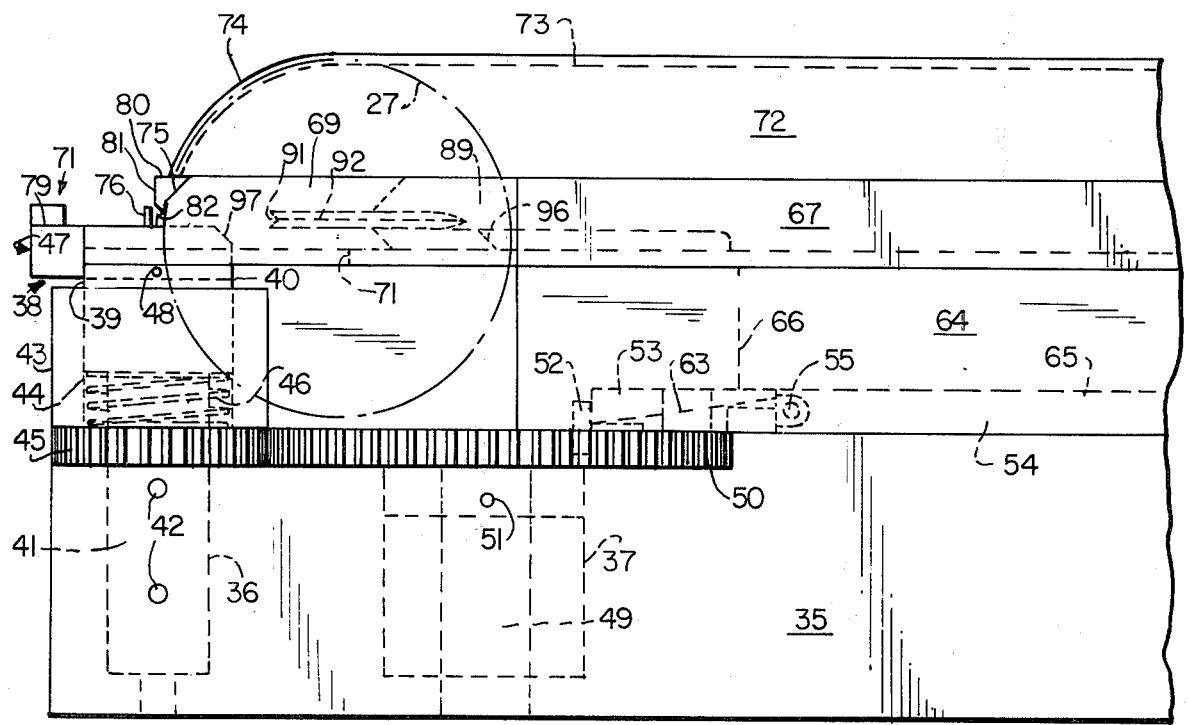
FIG. 3 is a side view of the preforming and insertion assemblies.

Mounted on housing 11 between indexing wheels 27 and 28 is the preforming and insertion assemblies to be described in detail in conjunction with FIGS. 1, 2 and 3. A base 35, mounted to housing 11, has two circular recesses 36 and 37 (FIG. 3). A locator housing 38 having a head 39 with a slot 40 therein and a shaft 41 is secured in recess 36 by fasteners 42 to prevent rotational movement of locator housing while allowing vertical movement. Encompassing locator housing 38 in a bore 44 is a cutter housing 43 to the bottom of which is mounted a gear 45. In bore 44 between the gear 45 and the bottom of head 39 of locator housing 38 is a coil spring 46. As will be explained more fully later, this allows the portions of the preforming assembly to be moved out of the path of the insertion assembly.

A locator 47 rests in slot 40 of locator housing 38 and is secured thereto by fastener 48. The locator 47 will be described in more detail later on.

In circular recess 37 is a shaft 49 to which is secured a gear 50 by fastener 51. A bushing is also provided in circular recess 37 since shaft 49 and gear 50 rotate relative to the base 35. Mounted to gear 50 is a follower pin 52, which will determine the position of gear 50, gear 45 and cutter housing 43.

A cam head 53 is pivotally attached to a cam arm 54 by pin 55; also attached to cam arm 54 is a return arm 56. During the forward movement of cam arm 54, follower pin 52 moves along surfaces 57, 58 and 59 of cam head 53, surfaces 60 and 61 of return arm 56 and surface 62 of cam arm 54. This causes gear 50 to rotate clockwise along surface 57, stop rotation and hold that position along surface 58, rotate counter-clockwise to its original position along surfaces 59 and 60, and maintain the initial position along surfaces 61 and 62. As will be explained later, this allows the arcuate travel of a combined cutter, bender and preforming elements and later reversal to clear the path for the insertion assembly. Since no rotation is needed during the return stroke, a slot 63 is provided aligned with the surfaces 61 and 62. The slot 63 is inclined from surface 57 to surface 59 so that the cam head 53 rotates up to allow the follower pin 52 to pass through.

A cam guide 64 is secured to the base 35 by fasteners (not shown) and has a slot 65 to receive the cam arm 54 and return arm 56 and a second recess 66 to allow the pivotal movement of cam head 53. An insertion assembly guide 67 is secured to, and extends beyond, cam guide 64 so as to lie above locator housing 38. The insertion assembly guide 67 terminates in curved surface 68 to be coincident with the locator housing head 39. A channel 69 traverses the entire length of the insertion assembly guide 67. Within channel 69, beginning at the curved surface 68, is a slot 70 which terminates at 71 and has a width large enough to receive the locator 47. The top terminating edge of the insertion assembly guide 67 is bevelled at 75 to allow clearance for the lead portion of the electrical components. Secured to the insertion assembly guide 67 by fasteners (not shown) is a cover plate 72 (removed in FIG. 2) having a groove 73 therein (See FIG. 1) to accommodate the body portion of the electrical component. The terminating surface 74 of the cover plate 72 is curved to coincide with the curvature of the indexing wheels 27 and 28 (which are shown in phantom in FIG. 3).

Referring to FIG. 2, the locator 47, which as previously described is secured to locator housing 38, includes a bending post 76 and an anvil 77. As shown in FIG. 1, one lead of an electrical component resets above the bending post 76 which is aligned in a plane. The anvil 77 has a channel 78 to receive a hammer (to be described below) to preform the end of the lead of the electrical component to an L-shape. The height of the anvil is reduced at 79 to receive the other lead and act as a stop.

Mounted to the cutter housing 43 is a combined cutter, bender and hammer 80. The surface 81 of hammer 80 has a V-notch 82 (FIG. 3) to receive the lead of the electrical component. Surface 83 is connected to surface 81 by surface 84, and in combination, forms an L-shaped hammer to cooperate with anvil 77 to preform an L-shaped lead. The terminating edge 85 of surface 83 is a shearing edge which acts with a shearing block 86 (FIG. 1) to sever the surplus lead material and sever the lead from the tape carrier. A second and separate securing block 87 severs the other lead of the electrical component from the tape carrier in combination with indexing wheel 27. Both of the shearing blocks 86 and 87 are pivotally mounted to housing 11 and have different heights so as to sever the leads at different and distinct times in the operation cycle to be described in connection with FIGS. 4–10. Though cutter/bender/hammer 80 is shown as a separate element, it is obvious that it may be formed as a single element with the cutter housing 43.

The insertion assembly includes two outside supporters 88 and 89 and a driver 90. Outside supporter 89 is used in the preforming cycle to bend a section of one of the leads and thus has a V-notch 91 in its leading surface. Both outside supports 88 and 89 have a channel 92 therein to receive the preformed leads and thereby support and guide the leads into prealigned holes in a circuit board. Outside supporter 88 also has a V-notch 91 to receive a portion of the lead.

The driver 90 includes a forward surface 93, connected to a curved surface 94 by an internal surface 95. The forward surface 93 receives a part of the L-shaped lead, internal surface 95 receives the body portion of the electrical component and curved surface 94 receives the U-shaped portion of the other lead. The lower lead edge of driver 90 is bevelled at 96 to act as a cam surface. The top rear edge of locator 47 also has a bevelled edge 97 to act as a cam surface and cooperate with cam surface 96 to depress locator 47 to remove post 76 and anvil 77 from the path of the insertion assembly.

Referring now to FIGS. 4–10, the sequence of cutting, bending, preforming, bending and inserting an electrical component into a circuit board is illustrated. The electrical components having a body section B, a right lead RL and a left lead LL are sequentially fed to a first plane by the indexing wheels 27 and 28 so that a portion of the lead RL rests above bending post 76.

Figure 5:
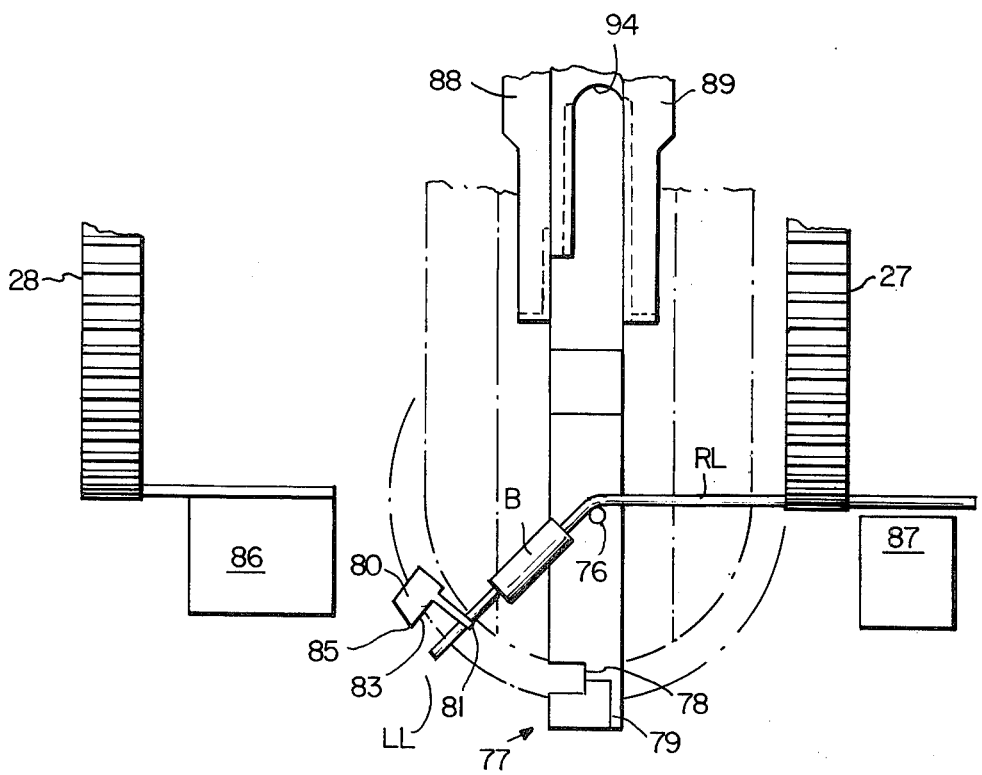
Figure 6:
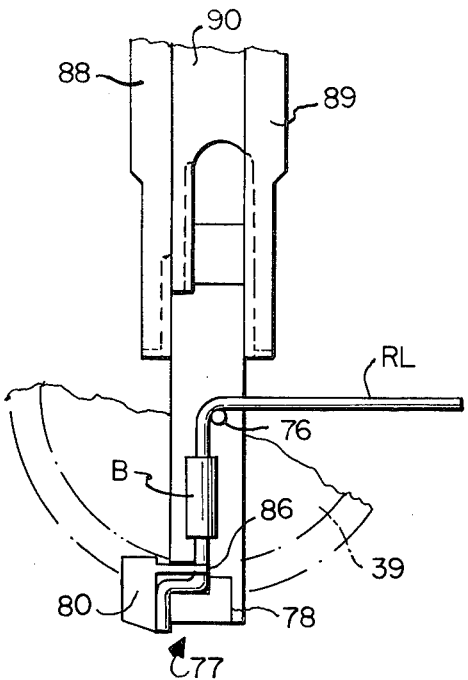

The bender 80 starts its travel along an arcuate path in the plane defined by the leads LL and RL and the body portion B. As the shearing edge 85 meets the shearing block 86, the surplus lead material is severed from the lead LL. The lead LL, the body portion B, and a section of the lead RL which is contiguous to the body B are bent around the bending post 76 as illustrated in FIG. 5. The bender 80 continues its arcuate path completing it as shown in FIG. 6 at a point in a plane perpendicular to the first plane as shown in FIG.

4.

Figure 4:
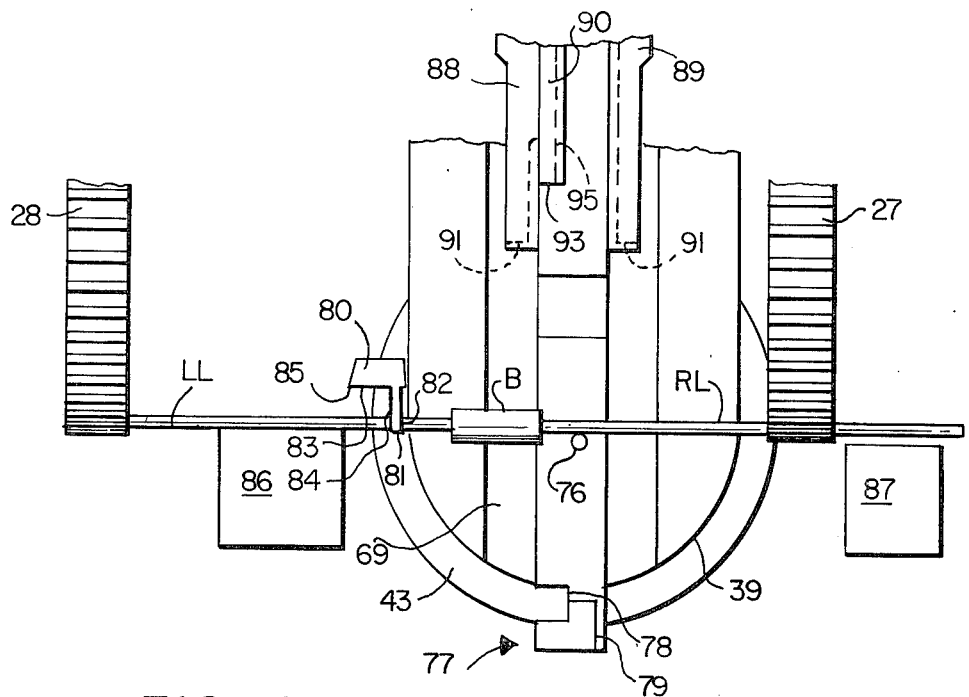
FIGS. 4–10 show the series of preforming and insertion operations on an axial lead component.

Prior to the termination of the travel of the arcuate path, the bender 80 becomes a hammer which, in combination with the anvil 77, puts an L-shaped bend on the end of lead LL. The body B, the lead LL and portion of the lead RL now lie in a plane perpendicular to the original plane as shown in FIG. 4 and which the remainder of the lead RL is in. Referring briefly to FIG. 2, it should be noted that the follower pin 52 has completed its travel along the surface 57 of the cam head.

Figure 7:
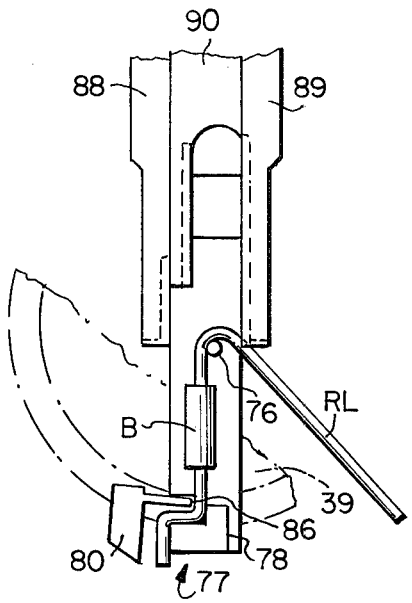
Figure 8:
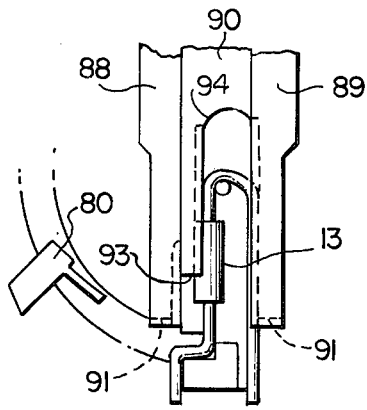

The insertion assembly, including outside supporters 88 and 89 and driver 90, start their descent. At this time, the severing block 87 is pivoted by a drive linkage (not shown) so as to rise from the position shown in FIG. 4 where the surplus lead material is severed from lead RL by severing block 87 and feed indexing wheel 27. At this point, both the leads LL and RL have been severed from the tape carrier leaving surplus lead material with the carrier. As illustrated in FIG. 7, the outside support 89 becomes a bender assembly acting on lead RL as shown in FIG. 7, The lead RL is bent by outisde supporter 89 so as to be parallel to the body or in a plane perpendicular to the original plane illustrated in FIG. 4. This final position is illustrated in FIG. 8. As the total insertion assembly has travelled the postion illustrated between FIGS. 6, 7 and 8, the follower pin 52 has travelled along surface 58 so as to maintain its position as shown in FIG. 6 along surface 59 of the cam head 53 so as to remove the hammer 80 out of the path of the insertion assembly.

Figure 9:
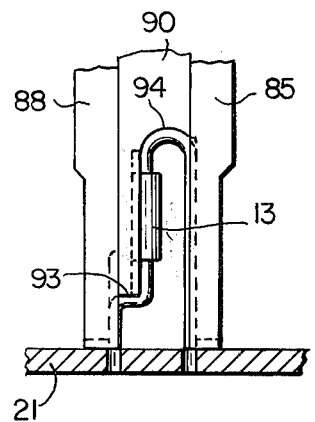
Figure 10:
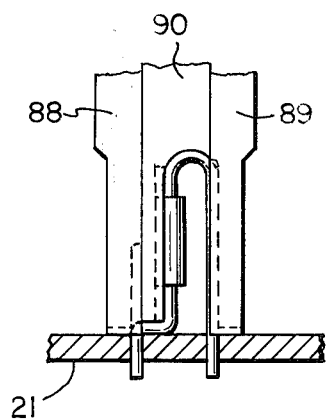

As illustrated in FIGS. 3 and 8, the curved surface 95 and the leading edge 93 of driver 90 are not yet in contact with any portion of the electrical component or its leads. At this point, the two cam surfaces 96 of the driver 90 and 97 of the locator 47 intersect so as to force the locator assembly down out of the path of the insertion assembly removing post 76 and anvil 77. The motion between FIGS. 8 and 9 are such that the curved surface 94 of the driver assembly is in contact with the portion of lead RL which remained substantially in the original plane as illustrated in FIG. 4 and leading surface 93 comes in contact with a portion of the L-shaped preformed end of lead LL which is parallel to the original plane. As illustrated in FIG. 9, the insertion assembly carries the bent and preformed component down to the circuit board 21. As outside supporters 88 and 89 meet at the surface, they are stopped and the driver 90 which is resiliently connected thereto continues its motion, forcing the leads into apertures in the circuit board by force applied to the lead portions. When this motion is completed as in FIG. 10, the lead clinching mechanism 20 as incorporated herein from the previously mentioned application, cuts and clinches the leads to the lower end of the circuit board.

Thus, the present apparatus severs, bends and preforms and inserts axial lead components such that the axis of the body of the component is perpendicular to the circuit board and thus increases the packing density on the circuit board. From the preceding description of the preferred embodiments, it is evident that the objects of the invention are attained. Although the invention has been described and illustrated in detail, it is to be clearly understood that the same is by way of illustration and example only and is not meant to be taken by way of limitation. The spirit and scope of this invention are limited only by the terms of the appended claims.

What is claimed is:

1. An apparatus for processing electrical components having a body portion and a first and second lead portion extending from the body portion in opposite directions comprising:
   means for sequentially feeding said components;
   means for aligning said feed component in a first plane;
   means for severing surplus lead material from said first and second lead portions;
   first means for bending said first lead so that said second lead, said body and a first section of the first lead contiguous to said body are substantially perpendicular to said first plane;
   means for forming the severed extremity of said second lead at the termination of the operation of said first bending means, said forming means including an anvil aligned substantially perpendicular to said first plane to cooperate with said first bending means to form the severed end of said second lead at the termination of the operation of said first bending means; and
   second means for bending a second section of said first lead so that said second section is also substantially perpendicular to said first plane.

2. The apparatus of claim 1 wherein said severing means includes a first means for severing said first lead and a second means for severing said second lead independent of said first severing means.

3. The apparatus of claim 1 wherein said first bending means includes an L-shaped surface and said anvil has a corresponding L-shaped surface for forming an L-shaped bend on said second lead.

4. The apparatus of claim 1 wherein said first bending means includes a member which travels an arcuate path starting at a first point in said first plane and ends at a second point in a plane substantially perpendicular to said first plane.

5. The apparatus of claim 4 wherein said severing means includes a shearing block adjacent said first point, said forming means includes an anvil adjacent said second point and said member of said first bending means includes a shearing surface and a hammer surface cooperating with said shearing block and anvil, respectively, to sever and form said second lead during the arcuate travel of said first bending means member.

6. The apparatus of claim 4 wherein said second bending means includes a slidable member which travels a linear path perpendicular to said first plane.

7. The apparatus of claim 1 including insertion means for holding a component subsequent to the operation of said first and second bending means and insert it into prealigned holes in a circuit board.

8. The apparatus of claim 7 wherein said second bending means includes a first slidable member which travels a linear path perpendicular to said first plane and said insertion means includes said first slidable member for contacting said first lead, a second slidable member for contacting said second lead and a third slidable member between said first and second slidable members contacting a section of a lead in a second plane substantially parallel to said first plane, said first, second and third members travel a linear path perpendicular to said first plane.

9. The apparatus of claim 8 wherein said forming means produces an L-shaped bend on said second lead, and said third member contacts a section of said L-shaped bend which is in said second plane.

10. The apparatus of claim 9 wherein said third member also contacts a section of said first lead which lies in said first plane.

11. The apparatus of claim 8 wherein said first and second members are resiliently connected to said third member so that said third member drives the leads into said prealigned holes after said first and second members have terminated their travel adjacent said circuit board.

12. The apparatus of claim 7 wherein said aligning means and said forming means each include an element in the path of travel of said insertion means mounted on a resilient base, said base having a first cam surface and said insertion means having a second cam surface, said cam surfaces cooperating to force said elements of said aligning means and of said forming means out of the path of travel of said insertion means.

13. The apparatus of claim 1 wherein said components are parallel taped by two tapes secured to the extremities of said first and second leads and said feeding means includes means for engaging and sequentially advancing taped component to said aligning means.

* * * * *